United States Patent
Komatsu et al.

(10) Patent No.: US 10,580,922 B2
(45) Date of Patent: Mar. 3, 2020

(54) METHOD OF PROVIDING A BORON DOPED REGION IN A SUBSTRATE AND A SOLAR CELL USING SUCH A SUBSTRATE

(71) Applicant: STICHTING ENERGIEONDERZOEK CENTRUM NEDERLAND, Petten (NL)

(72) Inventors: Yuji Komatsu, Petten (NL); John Anker, Petten (NL); Paul Cornelis Barton, Petten (NL); Ingrid Gerdina Romijn, Petten (NL)

(73) Assignee: NEDERLANDSE ORGANISATIE VOOR TOEGEPAST-NATUURWETENS CHAPPELIJK ONDERZOEK TNO, The Hague (NL)

( * ) Notice: Subject to any disclaimer, the term of this patent is extended or adjusted under 35 U.S.C. 154(b) by 0 days.

(21) Appl. No.: 14/760,099

(22) PCT Filed: Jan. 9, 2014

(86) PCT No.: PCT/NL2014/050007
§ 371 (c)(1),
(2) Date: Jul. 9, 2015

(87) PCT Pub. No.: WO2014/109639
PCT Pub. Date: Jul. 17, 2014

(65) Prior Publication Data
US 2015/0357499 A1    Dec. 10, 2015

(30) Foreign Application Priority Data
Jan. 11, 2013  (NL) ..................................... 2010116

(51) Int. Cl.
*H01L 31/065* (2012.01)
*H01L 31/18* (2006.01)
(Continued)

(52) U.S. Cl.
CPC ........ *H01L 31/065* (2013.01); *H01L 21/2255* (2013.01); *H01L 21/324* (2013.01);
(Continued)

(58) Field of Classification Search
CPC ... H01L 31/065; H01L 31/0682; H01L 21/22; H01L 21/2255; H01L 21/2252;
(Continued)

(56) References Cited

U.S. PATENT DOCUMENTS

| | | | |
|---|---|---|---|
| 5,928,438 A | 7/1999 | Salami et al. | |
| 6,218,270 B1 | 4/2001 | Yasunaga | |

(Continued)

FOREIGN PATENT DOCUMENTS

| | | |
|---|---|---|
| DE | 10 2009 041546 A1 | 10/2010 |
| DE | 10 2011 002748 A1 | 7/2012 |
| WO | 2011/135249 A1 | 11/2011 |

OTHER PUBLICATIONS

Kim et al., "Silicon solar cells with boron back surface field formed by using boric acid", 2007, Proc. 22nd Eur. PV Solar Energy Conf. Exhib. 2007. All Pages.*

(Continued)

*Primary Examiner* — Daniel P Malley, Jr.
(74) *Attorney, Agent, or Firm* — Young & Thompson

(57) ABSTRACT

Method of providing a boron doped region (8, 8a, 8b) in a silicon substrate (1), includes the steps of: (a) depositing a boron doping source (6) over a first surface (2) of the substrate (1); (b) annealing the substrate (1) for diffusing boron from the boron doping source (6) into the first surface (2), thereby yielding a boron doped region; (c) removing the boron doping source (6) from at least part of the first surface (2); (d) depositing undoped silicon oxide (10) over the first surface (2); and (e) annealing the substrate (1) for lowering a peak concentration of boron in the boron doped region (8, (Continued)

Figure 1A:
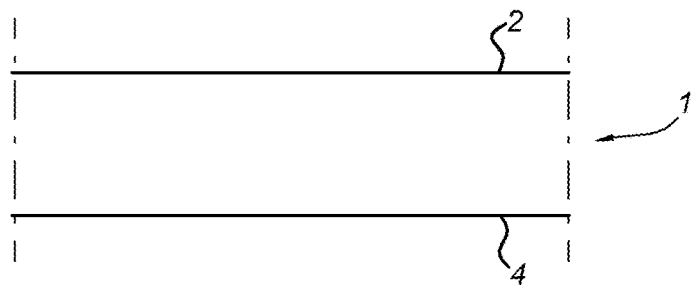

8a) through boron absorption by the undoped silicon oxide. The silicon oxide (10) acts as a boron absorber to obtain the desired concentration of the boron doped region (8).

18 Claims, 6 Drawing Sheets

(51) Int. Cl.
  *H01L 21/225* (2006.01)
  *H01L 21/324* (2006.01)
  *H01L 31/0352* (2006.01)
  *H01L 31/068* (2012.01)
(52) U.S. Cl.
  CPC ...... *H01L 31/03529* (2013.01); *H01L 31/068* (2013.01); *H01L 31/1804* (2013.01); *H01L 31/1864* (2013.01); *H01L 31/1868* (2013.01); *Y02E 10/547* (2013.01); *Y02P 70/521* (2015.11)
(58) Field of Classification Search
  CPC ..... H01L 21/225; H01L 21/324; H01L 21/38; H01L 21/383; H01L 21/385; H01L 31/022408; H01L 31/022441; H01L 31/022458
  See application file for complete search history.

(56) References Cited

U.S. PATENT DOCUMENTS

| | | | |
|---|---|---|---|
| 6,444,552 B1* | 9/2002 | Docter | H01L 21/2258 257/194 |
| 7,615,393 B1* | 11/2009 | Shah | H01L 21/223 438/476 |
| 7,704,866 B2* | 4/2010 | Vanheusden | H01L 31/022425 257/343 |
| 2005/0133835 A1 | 6/2005 | Bu et al. | |
| 2008/0176384 A1 | 7/2008 | Ko | |
| 2009/0205712 A1 | 8/2009 | Cousins | |
| 2009/0250793 A1* | 10/2009 | Sokolov | H01L 21/02129 257/636 |
| 2010/0015756 A1* | 1/2010 | Weidman | H01L 21/67155 438/96 |
| 2010/0055822 A1* | 3/2010 | Weidman | G01T 1/2018 438/57 |
| 2010/0009315 A1 | 4/2010 | Fujii | |
| 2011/0146782 A1* | 6/2011 | Gabor | H01L 21/228 136/256 |
| 2011/0300697 A1* | 12/2011 | Kohira | H01L 21/2254 438/546 |
| 2012/0024371 A1* | 2/2012 | Funakoshi | C23C 18/1608 136/256 |
| 2012/0167968 A1 | 7/2012 | Lossen et al. | |
| 2013/0112260 A1 | 5/2013 | Bazer-Bachi et al. | |
| 2013/0267059 A1* | 10/2013 | Kim | H01L 31/0682 438/87 |
| 2014/0065764 A1* | 3/2014 | Scardera | H01L 31/022441 438/98 |

OTHER PUBLICATIONS

Thomas Krygowski et al.: "A Simultaneously Diffused, Textured, In Situ Oxide AR-Coated Solar Cell Process (STAR Process) for High-Efficiency Silicon Solar Cells" IEEE Transactions on Electron Devices, IEEE Service Center, Piscataway, NJ, US, vol. 45, No. 1, Jan. 1, 1998 (Jan. 1, 1998), XP011016393, ISSN: 0018-9383 the whole document.
Arai E et al:"Applicability of Phosphorus and Boron Diffusion Parameters Extracted From Predeposition to Drive-In Diffusion for Bulk Silicon and Silicon-On-Insulator", Japanese Journal of Applied Physics, The Japan Society of Applied Physics, Japan Society of Applied Physics, Tokyo; JP, vol. 42, No. 4A, Part 01, Apr. 1, 2003 (Apr. 1, 2003), pp. 1503-1510, XP001191392, ISSN: 0021-4922, DOI: 10.1143/JJAP.42.1503 the whole document.
International Search Report, dated Apr. 1, 2014, from corresponding PCT application.

* cited by examiner

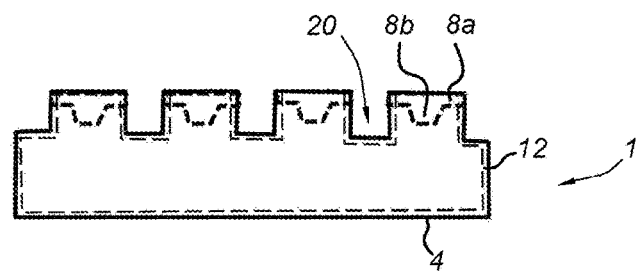
Fig. 4f
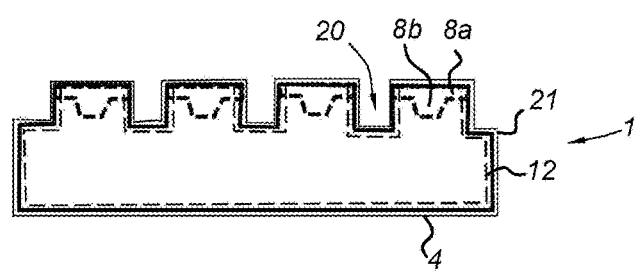
Fig. 4g
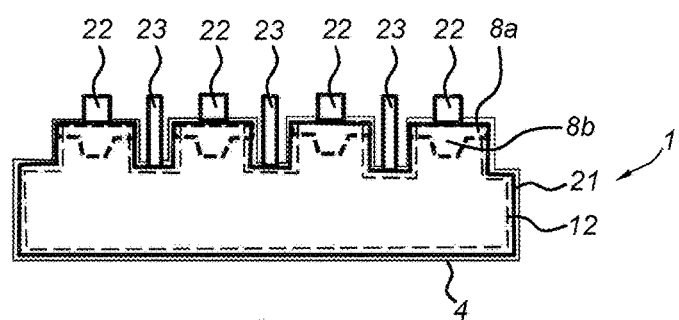
Fig. 4h
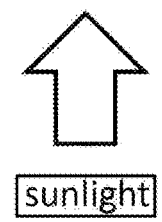

METHOD OF PROVIDING A BORON DOPED REGION IN A SUBSTRATE AND A SOLAR CELL USING SUCH A SUBSTRATE

FIELD OF THE INVENTION

The present invention relates to a method of providing a boron doped region in a silicon substrate.

PRIOR ART

U.S. Pat. No. 5,928,438 (Salami et al.) discloses a solar cell with a selective (boron) emitter. The solar cell comprises a semiconducting substrate having first and second surfaces, a first plurality of emitter regions formed in one of the first and second surfaces with a relatively low dopant concentration, a second plurality of emitter regions formed in said one of the first and second surfaces to a substantially greater depth than the first plurality of regions preferably with a relatively higher dopant concentration than the first plurality of regions. The semiconductor substrate preferably comprises n-type doped silicon, and the first plurality of emitter regions are preferably formed using a p+ type dopant material, such as boron. The second plurality of emitter regions is preferably formed from a p+ type dopant material comprising either pure aluminium or an alloy of aluminium and silicon. The dopant region formed in a second one of the substrate surfaces is preferably formed using an n+ type dopant material, such as phosphorus.

A lowly doped boron layer in a substrate and a selective low-high doping profile to allow the use of selective emitters in solar cells is disclosed in the article by N. Bateman et al., 'High quality ion implanted boron emitters in an interdigitated back contact solar cell with 20% efficiency', Energy Procedia 8 (2011), p 509-514. This however, requires costly processing steps.

SUMMARY OF THE INVENTION

The present invention seeks to provide a method of providing improved homogenous and selective boron doped regions or emitters having higher efficiencies at reasonable cost.

According to the present invention, a method according to the preamble is provided, wherein the method comprises:

a) depositing a boron doping source over a first surface of the substrate;

b) annealing the substrate for diffusing boron from the boron doping source into the first surface, thereby yielding a boron doped region;

c) removing the boron doping source from at least part of the first surface (i.e. completely or selectively);

d) depositing undoped silicon oxide over the first surface;

e) annealing the substrate for lowering a peak concentration of boron in the boron doped region through boron absorption by the undoped silicon oxide.

The processing steps (a) and (b) may be combined in a single process, which as such is known to the skilled person. Annealing (step (b) and also step (e)) involves increasing the temperature of the substrate and subsequent cooling down of the substrate. Again, this may be accomplished using several techniques, which as such are known to the skilled person.

The boron doped region may be implemented as an emitter in an n-type substrate. Alternatively, the boron doped region may also be implemented when the substrate is a p-type substrate. In some applications, the p-type substrate is already doped with boron, but in low concentration. The term boron doped region is then to be understood as a highly doped region, where the boron concentration is much higher (e.g. at least a factor 100) than in the rest of the substrate.

Dependent on what type of boron doped region is to be obtained, removing the boron doping source (c) comprises complete or selective (partial) removal of the boron doping source. In particular, the complete removal of the boron doping source from the first surface implies obtaining a homogenous boron doped region, whereas the selective (partial) removal of the boron doping source from the first surface implies obtaining a selective boron doped region.

The method of the present invention embodiments thus yields a boron doped region comprising a continuous boron doped layer having a generally low homogenous boron concentration, i.e. a homogenous boron doped emitter, or a continuous boron doped layer having smoothly interspersed regions of higher and lower boron concentration, i.e. a selective boron doped emitter.

The annealing of deposited undoped silicon oxide pulls out boron atoms from the emitter, thus reducing the doping level. In the case of a selective emitter embodiment, annealing of the selectively remaining boron doping source keeps the high doping level for contacting. As a result, a selective emitter is obtained in the substrate having a high contrast of the boron doping level.

According to the present invention, the annealing (e) may further comprise diffusing phosphorus into a second surface of the substrate for yielding a phosphorus doped layer e.g. acting as a back surface field (BSF), wherein boron absorption and phosphorus diffusion occurs in the same processing step during the annealing. In practice, the annealing (e) requires at least 900° C., while phosphorus diffusion takes place between 780-860° C. Therefore the annealing and phosphorus diffusion do not necessarily take place simultaneously, but can be done consecutively in one process chamber. There is no necessity of heating up step for the phosphorus diffusion because it utilizes the cooling down sequence of the annealing (e). In this process step, the undoped silicon oxide film plays two roles: boron puller/absorber during anneal and diffusion barrier during phosphorus diffusion.

SHORT DESCRIPTION OF DRAWINGS

The present invention will be discussed in further detail hereinafter based on a number of exemplary embodiments with reference to the drawings, wherein:

FIG. 1*a-g* show intermediate phases of a substrate being processed according to a method embodiment of the present invention.

FIG. 2*a-d* shows intermediate phases of a substrate being processed according to a further method embodiment of a substrate according to the present invention.

Figure 3:
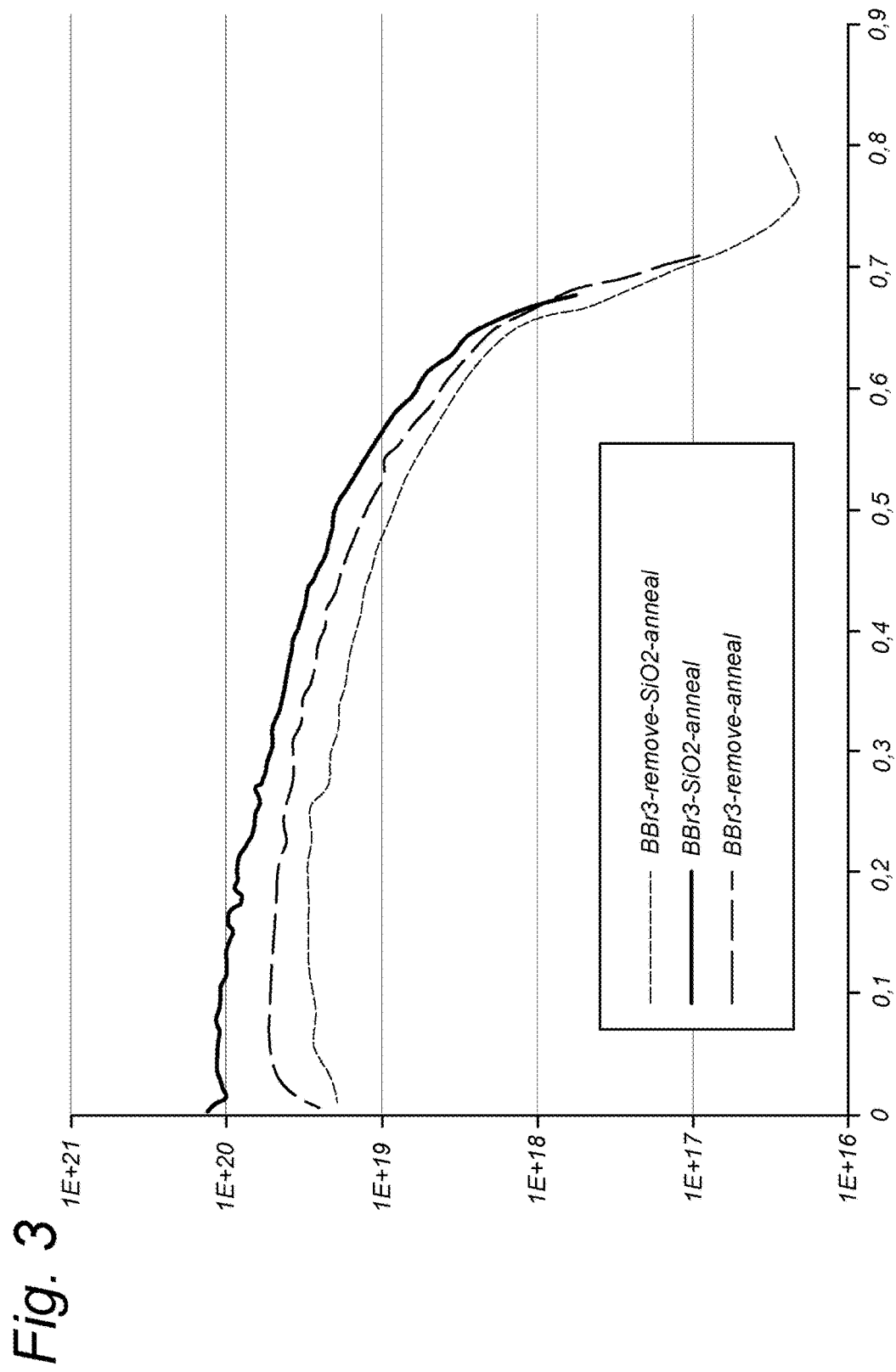

FIG. 3 shows exemplary graphs depicting boron doping profiles obtained using a method according to an embodiment of the present invention.

FIG. 4*a-h* shows phases of a substrate being processed according to yet a further method embodiment.

DETAILED DESCRIPTION OF EXEMPLARY EMBODIMENTS

According to the present invention, FIG. 1*a* shows a silicon substrate 1 to be provided with a boron-doped region, more particularly a homogenous or selective boron-doped emitter, which is specifically used in solar (photo-voltaic) cells. The substrate 1 comprises a first surface 2 and a second surface 4. The first surface 2 may be referred to as the front side and the second surface 4 may be referred to as the back side. In an embodiment, the silicon substrate 1 is a p-type substrate 1. In a further embodiment, the substrate 1 is a n-type substrate 1.

The substrate 1 defined above and depicted in FIG. 1a is subsequently subjected to processing steps of an embodiment of the method of the present invention for providing a boron-doped region 8 in a silicon substrate 1, wherein labels such as (a), (b), (c), . . . etc. will be used to label and conveniently refer to the functional processing steps of the method.

Figure 1B:
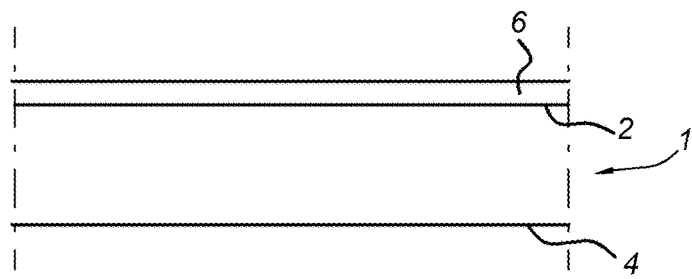

Depicted in FIG. 1b, the method embodiment of the present invention comprises depositing (a) a boron doping source 6 over the first surface 2 of the substrate 1. In typical embodiments, the boron doping source 6 will be a layer covering the first surface 2 of the substrate 1. In a group of embodiments, the depositing (a) of the boron doping source 6 may comprise a Borosilicate glass (BSG) formation by a $BBr_3$ process or a $BCl_3$ and $O_2$ process at a high temperature, e.g. higher than 850° C., typically between 900-950° C. In other embodiments, the depositing (a) of the boron doping source 6 may comprise chemical vapor deposition (CVD) of BSG, or solid boron, or amorphous boron, or $B_2O_3$, or a mixture thereof. $B_2O_3$ is at liquid phase at 550~1500° C., while the other diffusion sources mentioned are at solid phase. $B_2O_3$ can stay on the substrate as spreading liquid on the surface and can work as a diffusion source. In yet another embodiment, the depositing (a) of the boron doping source 6 may comprise spin coating of boron.

Figure 1C:
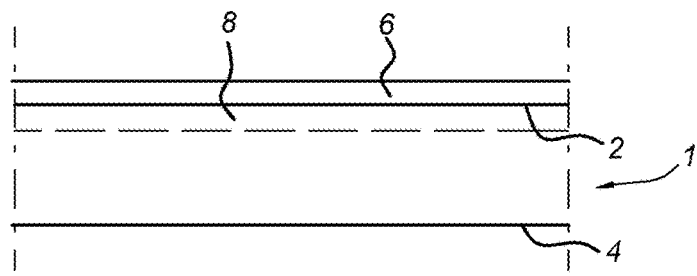

Depicted in FIG. 1c, the method embodiment of the present invention further comprises annealing (b) the substrate 1 for diffusing boron from the boron doping source 6 into the first surface 2 of the substrate 1, thereby yielding a boron doped region or emitter 8 in the first surface 2 having a depth and a peak concentration of boron. In an advantageous embodiment, the annealing (b) comprises the step of heating the substrate to a temperature of at least 850 degrees Celsius.

Conventionally, the peak concentration of a boron-doped region 8 made by diffusion is the same as its solid solubility limit, i.e. 2E20/cm3. To improve the surface passivation and to decrease minority carrier recombination in the boron-doped region 8, the peak concentration should be lowered significantly, particularly between the contact fingers in the case of a selective emitter, i.e. the illuminated or transparent areas.

According to the present invention, the term "annealing" refers to a heat treatment of a specimen followed by the cooling of said specimen, such as heating the substrate 1 to a predetermined temperature for a predetermined time period after which the substrate 1 is actively or passively cooled, e.g. cooled to an ambient temperature.

Figure 1D:
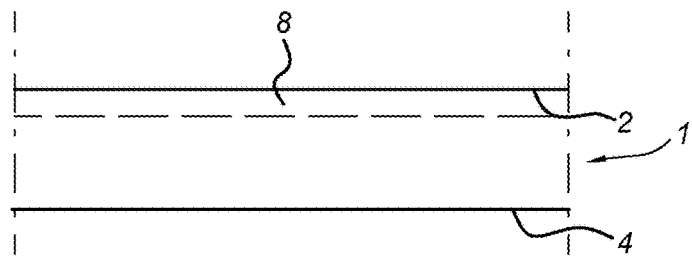
Figure 1E:
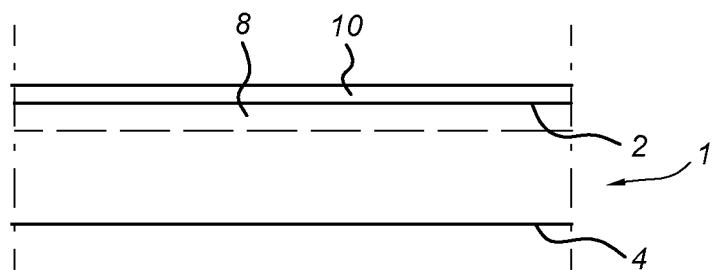
Figure 1F:
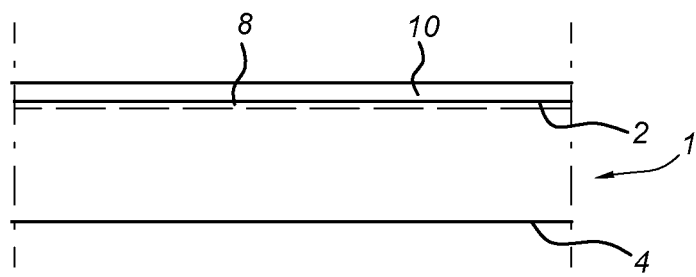

The further processing step in the method according to the present invention is the removal of at least part of the boron doping source 6. In FIGS. 1d-1f the method embodiment is shown where the entire boron doping source 6 is removed in order to obtain a uniform and homogeneous boron-doped region 8. In FIGS. 2a-2d a further method embodiment is shown where the boron doping source 6 is partly removed, e.g. to allow formation of a selective emitter 8.

Depicted in FIG. 1d (and also in FIG. 2a), the method of the present invention further comprises removing (c) the boron doping source 6 completely or selectively from the substrate 1. In the embodiment shown in FIG. 1d, the removing (c) comprises removing the boron doping source 6 completely from the substrate 1. As a result, the first (now boron-doped) surface 2 is fully exposed and not covered by the boron doping source 6. In the embodiment shown in FIG. 2a, the removing step (c) comprises removing the boron doping source 6 selectively to obtain a selective boron doping source 6. The selective boron doping source 6 may be envisaged as a patterned or grid-like structure such as a grid of generally parallel "fingers" over the first surface 2.

In practice, some residue could stay on the region 8 after the boron doping source 6 is removed. When the doping source is BSG, $B_2O_3$, or spin coating of boron, the most part of the source can be easily removed by a wet chemical process at the room temperature. The residue, typically a few nm of boron silicide ($B_xSi$, x=1~6), is hard to remove. It is also called a "boron-rich layer", or BRL. In other case, stronger etchant (the etching solution is heated in most of the cases) may be used to remove the BRL completely. In this case, some surface part of the region 8 is then also etched together with the BRL. This etching depth is not deeper than that of the region 8. In practice, it is between almost 0 nm and half of the depth of the region 8. In both cases, the final boron peak concentration after the anneal (e) can be tuned to 5E19/cm3 at highest. The boron in the BRL can also be pulled out into the undoped silicon oxide film.

In an embodiment, the removing (c) comprises etching the boron doping source 6 for removing the boron doping source 6 completely or selectively. In another embodiment, the removing (c) may further comprise removing a small surface area of the first surface 2 of the substrate 1. This would allow further shaping of the doping profile of the region 8 near the first surface 2 of the substrate 1.

In summary, in case a homogenous boron doped region is to be obtained, the removing (c) comprises removing (c) the boron doping source 6 completely. In case a selective boron doped region (emitter) is to be obtained, the removing (c) comprises removing (c) the boron doping source 6 selectively to obtain a grid-like structure for the boron doping source 6.

Figure 2A:
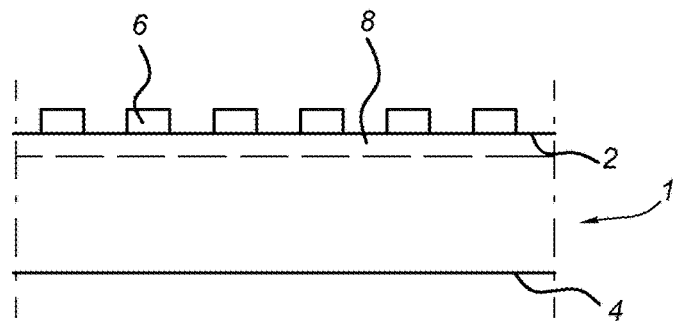
Figure 2B:
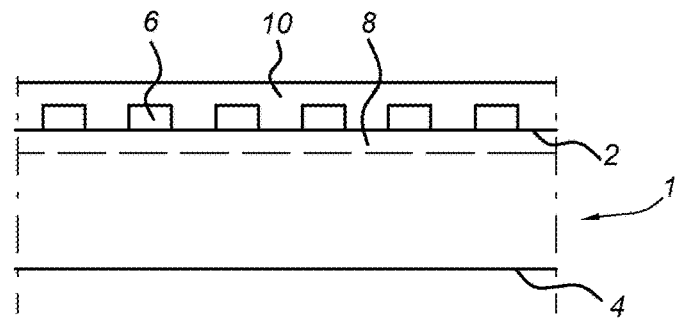

Depicted in FIG. 1e and FIG. 2b, the method embodiments of the present invention further comprises depositing (d) undoped silicon oxide 10 over the first surface 2. In the embodiment of FIG. 1e, the undoped silicon oxide 10 completely adjoins and covers the first surface 2 as the boron doping source 6 has been removed completely. In the embodiment of FIG. 2b, the undoped silicon oxide 10 adjoins and covers both the selective boron doping source 6 as well as the first surface 2 between the grid, i.e. the parallel "fingers" 6. Thus, the depositing (d) of undoped silicon oxide 10 over the first surface 2 means that undoped silicon oxide 10 is deposited over the first surface 2 as well as over the selective boron doping source 6 if it is present.

In an embodiment, the depositing (d) comprises chemical vapor deposition of undoped silicon oxide. In a further embodiment, the depositing (d) comprises baking a liquid coating of undoped silicon oxide, and typically the liquid comprises silanol ($SiH_3OH$). In all embodiments, the term silicon oxide (film) is used, which is understood to include depositions with the formula $SiO_2$, $SiO_x$ (1<x≤2), or $SiO_x:H$ (1<x≤2). It is noted that CVD silicon oxide and spun-on silicon oxide are normally not stoichiometric.

Figure 2C:
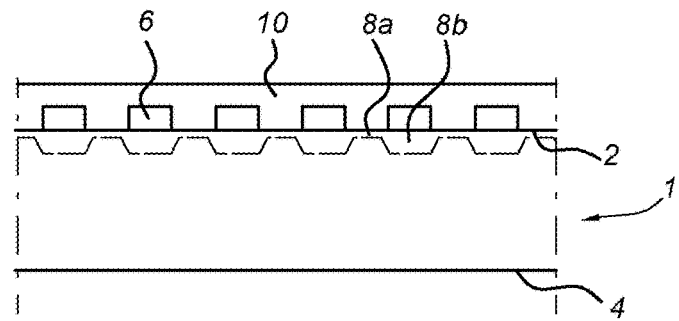

Depicted in FIG. 1f and FIG. 2c, the method embodiments of the present invention further comprises annealing (e) the substrate 1 for lowering the peak concentration of the boron doped region 8 in the first surface 2. In the annealing step (e) of the present invention embodiments, the undoped silicon oxide 10 acts as a boron absorber for pulling boron from the boron doped region 8, thereby lowering the peak concentration of boron in the boron doped region 8.

In the embodiment shown in FIG. 1f, the undoped silicon oxide 10 is embodied as a layer 10 for absorbing, pulling or extracting boron from the boron doped region 8 homogenously during the annealing (e), thereby yielding a homogenous boron doped region 8 having a lowered peak concentration (as indicated by the smaller size of region 8 in comparison with FIG. 1e). In an embodiment, the homogenous boron doped region 8 has a peak concentration lower than 5E+19/cm3 or even lower than 3E+19/cm3. The sheet resistance of said emitter (8) is at least 30 ohm/sq, which allows good bonding to the actual (metal) electrode of the solar cell later on in the processing.

In the embodiment of FIG. 2c, the annealing (e) is applied to the selective boron doping source 6. In this embodiment, the undoped silicon oxide 10 is embodied as a layer 10 for absorbing, pulling or extracting boron from the boron doped emitter 8 and the boron doping source simultaneously. In this embodiment of the emitter 8 this results in lowly doped regions 8a and highly doped regions 8b directly under the still present boron doping source 6.

The lowly doped regions 8a refer to the areas which will be illuminated during actual use of the solar cell, i.e. between surface contacts (e.g. electrodes) of the substrate 1. The highly doped regions 8b on the other hand refer to the areas of the surface 2 to which surface contacts will be applied, and which therefore need a low as possible contact resistance.

In an embodiment, the selective lowly boron doped region 8a has a peak concentration lower than 5E19/cm3 or even lower than 3E19/cm3, and wherein a sheet resistance of the lowly doped region 8a is between 30 and 200 ohm/sq. The peak concentration of boron at the opaque spots of highly doped regions 8b remains relatively high (in the order of 1E20/cm$^3$ since the annealing (e) further anneals the selective boron doping source 6 only). That is, undoped silicon oxide 10 cannot absorb boron from the highly doped regions 8b as silicon oxide is blocked by the selective boron doping source 6 during the annealing step (e).

In advantageous embodiments, the annealing (e) comprises heating the substrate 1 to a temperature of at least 900 degree Celsius, e.g. 940 degree Celsius. E.g. the annealing is performed in a temperature range between 900-1150° C., e.g. between 940-1100° C.

Figure 1G:
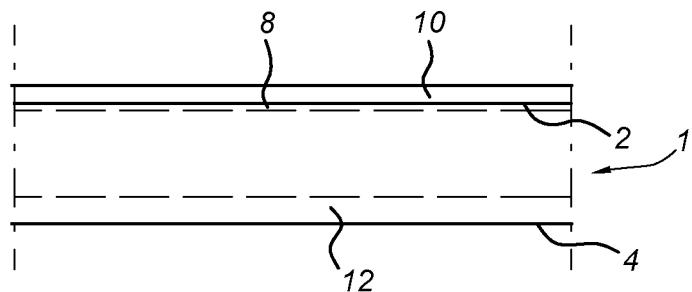
Figure 2D:
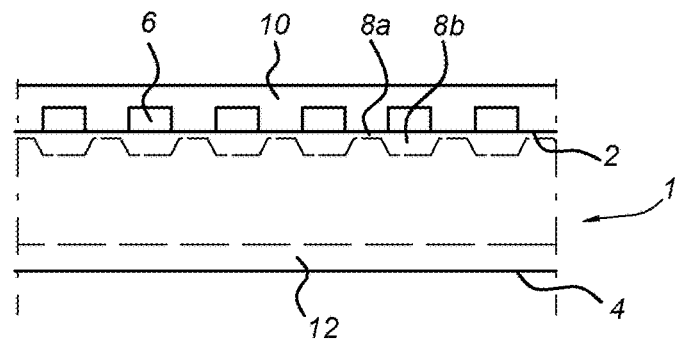

Depicted in FIG. 1g and FIG. 2d, the annealing (e) of the present invention may further comprise diffusing phosphorus into a second surface 4 of the substrate 1, thereby yielding a phosphorus doped layer 12 acting as a back surface field (B SF).

According to an embodiment of the present invention, the annealing (e) at a sufficiently high temperature allows for a one step process wherein boron absorption at the first surface 2 and the phosphorus diffusion at the second surface 4 is accomplished simultaneously or consecutively (i.e. at different temperature ranges during the annealing (e)). This one step process is made possible as the undoped silicon oxide layer 10 acts as a boron absorber as well as a diffusion barrier against phosphorus, preventing phosphorus diffusion into the homogenous or selective boron doped region 8.

In an embodiment, the phosphorus doped layer 12 has a surface concentration higher than 1E20/cm3. In another embodiment, the step of diffusing phosphorus into the second surface 4 comprises a POCl$_3$ process. In a specific embodiment a specific processing step is further applied to remove thin oxide that may have formed during the annealing (e).

In view of the detailed method step (a) to (e) disclosed so far, the method of the present invention can thus be summarized as a method of providing a boron doped region 8 in a silicon substrate 1, comprising the steps of:

a) depositing a boron doping source 6 over a first surface 2 of the substrate 1;

b) annealing the substrate 1 for diffusing boron from the boron doping source 6 into the first surface 2, thereby yielding a boron doped region 8;

c) removing the boron doping source 6 completely or selectively;

d) depositing undoped silicon oxide 10 over the first surface 2 for boron absorption;

e) annealing the substrate 1 for lowering a peak concentration of boron in the boron doped region 8 through boron absorption by the undoped silicon oxide.

The annealing step (e) may further comprise diffusing phosphorus into a second surface 4 of the substrate 1 for yielding a phosphorus doped layer 12, wherein the boron absorption and phosphorus diffusion occurs simultaneously, or consecutively in a single process step. That is, the annealing step (e) can be combined with phosphorous diffusion for obtaining a back surface field (BSF) using the silicon oxide as the diffusion barrier. In an embodiment, the depositing (a) and annealing (b) can be combined in a single processing step, i.e. requiring only one loading/unloading process with one process chamber It is important to note that the annealing (b) generally yields a homogenous boron doped region 8. The removing (c) then offers the choice of whether to retain a homogenous boron dope region 8 by removing the boron doping source 6 completely or obtain a selective boron doped emitter by selectively (partially) removing the boron doping source 6 for obtain e.g. a grid-like structure.

The present invention therefore provides an efficient method for providing a boron doped emitter 8. Depending on the removal step (c), the emitter 8 comprises a continuous boron doped layer having a generally homogenous concentration of boron, i.e. a homogenous boron doped emitter, or a continuous boron doped layer provided with smoothly interspersed regions 8a, 8b of higher and lower boron concentration, i.e. a selective boron doped emitter 8.

The present invention embodiments may also be applied for further types of solar cells, such as interdigitated back contact solar cells. In such interdigitated back contact solar cells, the boron-doped emitter 8 is provided on the back surface of the substrate 1, alternating with a phosphorus doped layer 12, e.g. in a strip-like manner. The present method embodiments may also be applied, and the boron extraction and phosphor diffusion may be achieved in a single annealing step (e) in the adjoining areas of the interdigitated back contact solar cell, after undoped silicon oxide 10 has been applied to the areas for the boron-doped emitter 8 only (d).

This sequence of processing steps is also shown schematically in FIGS. 4a-4h. The first side 2 of the substrate 1 is in this case the back side of the solar cell, and the second side 4 of the substrate 1 is the radiation receiving front side of the solar cell.

Figure 4A:
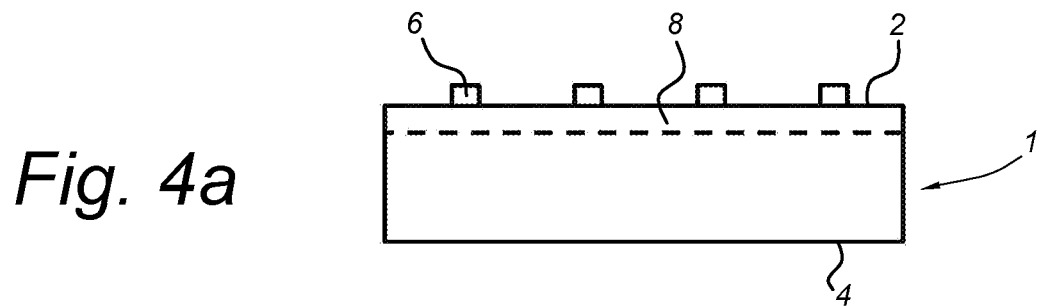

Up until the boron diffusion, the processing is similar to that depicted in FIGS. 1a-c. In the case of interdigitated back contact solar cells, again, the boron source 6 is removed in specific parts as shown in FIG. 4a. In general, the distance between remaining boron (strips) 6 is greater than in the embodiment of FIG. 2a, in order to accommodate the interposed phosphorus doped layers 12.

Figure 4B:
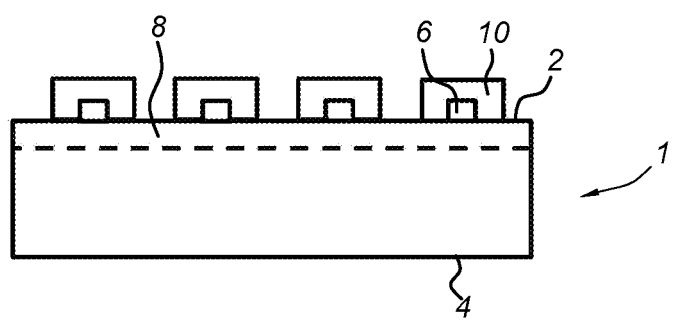
Figure 4C:
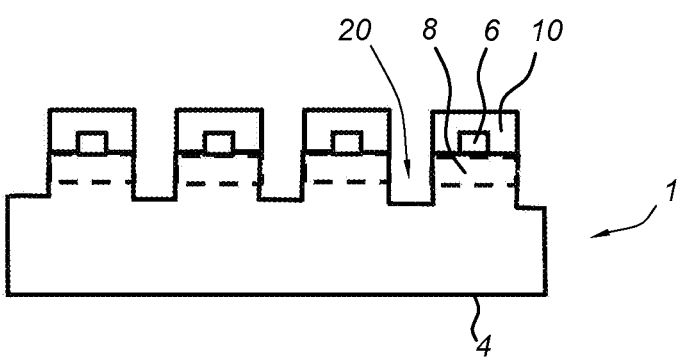

As shown in FIG. 4b, silicon oxide 10 is deposited on the first surface, and selectively removed. Where the silicon oxide 10 is removed, etching is applied to obtain deeper trenches 20 between the stack of boron doped region 8, silicon oxide layer 10 and boron source 6 (see FIG. 4*c*). In this step, the silicon oxide 10 functions as an etching barrier against alkaline solution (e.g. NaOH or KOH) which is often used to etch silicon.

Figure 4D:
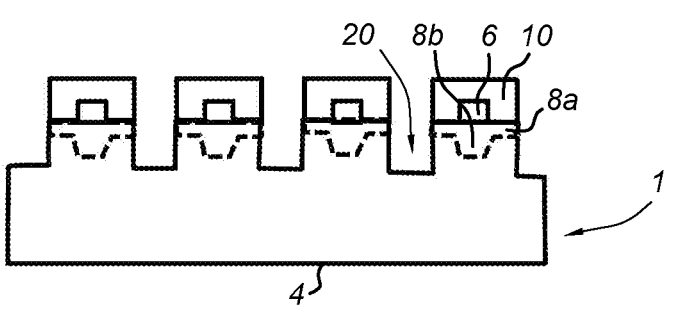

Consecutively, the substrate 1 is annealed, and a selective boron doping layer is formed (low doped region 8*a* and high doped region 8*b* directly under the boron source 6, as shown in FIG. 4*d*.

Figure 4E:
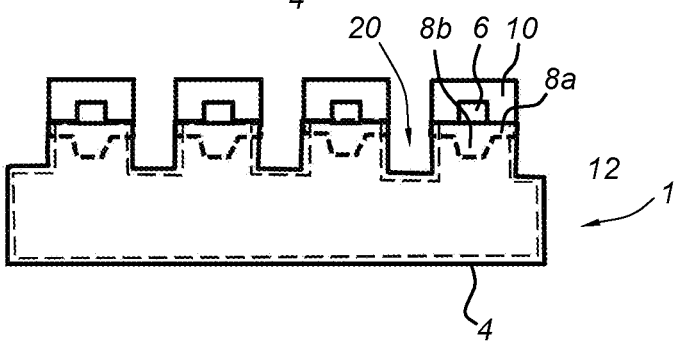

Also, in the same processing chamber, the step indicated in FIG. 4*e* is executed, i.e. a phosphorus diffusion, resulting in a phosphorus doped layer 12 at all sides of the substrate 1 except the region which is covered by the silicon oxide 10.

Then the undoped silicon oxide 10 is removed, as well as the boron source 6, as shown in FIG. 4*f* To further complete the interdigitated solar cell, a passivating film 21 is applied to the substrate 1 (i.e. all around), e.g. using thermal silicon oxide deposition, CVD SiN deposition, or $Al_2O_3$ atomic layer deposition, as shown in FIG. 4*g*. Finally, as shown in FIG. 4*h*, metal contacts 22 for the boron doped regions and metal contacts 23 for the phosphorus doped regions are implemented, e.g. using metal deposition/printing and fire through annealing, such that the metal penetrates the passivating layer 21 to reach the emitter 8 and phosphorus doped regions 12, respectively.

In an experimental set-up, the formation of a selective boron-doped emitter for a solar cell has been verified. In the examples, a $BBr_3$ process was applied to provide a boron doping source 6 on the surface 2 of the substrate 1 (a).

In a first example, the boron doping source 6 was removed (c) after the boron-doped emitter 8 was formed (b). Then a silicon oxide layer was applied using plasma enhanced chemical vapor deposition (PECVD) (d), and the resulting substrate 2 was annealed in an $N_2$ environment at 940° C. for 60 minutes (e).

In a second example, the boron doping source 6 was not removed, and the other steps were similarly applied (representing the part of the surface where the boron doping layer is not removed in actual applications.

Finally, a third, comparative, example was prepared without formation of the silicon oxide layer, but also the annealing was performed in an $N_2$ atmosphere at 940° C. for 60 minutes.

The resulting doping profiles are shown in FIG. 3, with the doping concentration on the vertical axis, and the depth into the surface 2 of the substrate 1 on the horizontal axis (in μm). The first example doping profile is the bottom graph (small dash line), the second example doping profile the top graph (solid line), and the third example doping profile the graph in between (large dash line).

The peak concentration went down from $1E+20/cm^3$ near the surface for the second example to about $3E+19/cm^3$ for the first example. Without the undoped silicon oxide, the decrease of the peak concentration is less as shown in the doping profile (large dash line). It is estimated that the peak concentration for first example can still be lowered even further by tuning the depositing and annealing while keeping the peak concentration of the second example.

According to further embodiments of the present invention, the method of the present invention further comprises processing steps to provide a complete solar cell. This involves providing the conductive contacts to the substrate, as e.g. already shown and described in relation to the interdigitated solar cell embodiment shown in the FIGS. 4*g* and 4*h* above.

The method then includes the further processing of the substrate, in general by removing the silicon oxide 10, at least in areas where conductive (e.g. metal) electrodes are to be formed on the substrate, passivation of the first and the second surface 2, 4, and providing conductive electrodes 22, 23. Removing the silicon oxide film 10 also includes removing the doping source 6 in case of the embodiments shown in FIG. 2*d* and FIG. 4*e*.

The actual contacting of the conductive electrodes 22, 23 with the substrate 1 can be accomplished in two different ways:

First is to provide the conductive electrodes 22, 23 on the first and/or second surface (e.g. using printing techniques, aligned with the high boron doped areas of the region 8 where applicable), and to fire through anneal the substrate so that the printed contact penetrates through the passivation film 21 to reach the region 8.

Alternatively, the passivation film is removed above the areas where the conductive electrodes 22, 23 are to be positioned (e.g. region 8*b* in case of FIG. 2*d*), and the conductive electrodes 22, 23 are applied where the passivation film 21 is partly removed.

The present invention is also embodied as a solar cell comprising a boron-doped region 8 as obtained by the method according to any one of the method embodiments described above. This can be visible in the doping profile as obtained for the boron-doped emitter (see FIG. 3 and description thereof), specific in the low level of doping which is unattainable using prior art methods. Also, the specific combination of doping profile when a selective emitter is present is a feature which can be made visible for a ready to use solar cell. In a further embodiment, the solar cell further comprises a contact made of Ag—Al alloy over the first surface 2. In an alternative embodiment, the solar cell comprises a seed contact made of Al over the first surface 2. These types of contacts match perfectly with the higher local doping level of boron in the emitter 8.

The normal process flow of an n-substrate solar cell 1 with boron emitter 8 and phosphorus BSF 12 has a process flow:
  (i) boron diffusion on the front side and boron source removal,
  (ii) undoped silicon oxide film on the front side as the diffusion barrier, and
  (iii) phosphorus diffusion on the rear side.

One novel aspect of the present invention is having the annealing step (e) in prior to (iii) which can be done consecutively in one process chamber. The invention does not increase the number of steps from the normal process flow, but only two extra procedures: (A) selective boron source removal at (i) and (B) annealing at higher temperature than phosphorus diffusion prior to (iii).

The new technology of the present invention embodiments is keeping the boron diffusion source under the diffusion barrier where metal contact will be formed. The boron surface concentration is kept high which enables low contact resistance.

The present invention embodiments have been described above with reference to a number of exemplary embodiments as shown in and described with reference to the drawings. Modifications and alternative implementations of some parts or elements are possible, and are included in the scope of protection as defined in the appended claims.

The invention claimed is:

1. A method of providing a boron doped region in a silicon substrate, comprising, in sequence:
    (a) depositing a boron doping source over a first surface of an n-type or p-type substrate;
    (b) annealing the substrate for diffusing boron into silicon from the boron doping source into the first surface, thereby yielding a boron doped region in the silicon substrate, a boron concentration of the boron doped region of the substrate being higher than a boron concentration of a remaining portion of the substrate when the substrate is a boron doped p-type substrate;

(c) selectively removing the boron doping source from at least part of the first surface, thereby yielding a selective boron doping source as a patterned structure over the first surface;

(d) depositing undoped silicon oxide over the selective boron doping source and the first surface between the patterned structure of the selective boron doping source; and (e) annealing the substrate that comprises, in one single processing step:

boron absorption by the undoped silicon oxide from the boron doped region, to lower a peak concentration of boron in the boron doped region between the patterned structure of the selective boron doping source, and phosphorous diffusion into a second surface of the silicon substrate to yield a phosphorus doped silicon layer, the boron absorption from the boron doped region and the phosphorus diffusion into the silicon substrate occurring simultaneously, wherein the second surface is on the opposing side of the substrate to the first surface.

2. The method of claim 1, wherein diffusing phosphorus comprises a $POCl_3$ process.

3. The method of claim 1, wherein the phosphorus doped layer has a surface concentration higher than 1E+20/cm3.

4. The method of claim 1, further comprising:
removing the silicon oxide;
passivation of the first and the second surface; and
providing conductive electrodes.

5. The method of claim 1, wherein the depositing (a) comprises borosilicate glass formation by a $BBr_3$ or $BCl_3$ process.

6. The method of claim 1, wherein the depositing (a) comprises chemical vapor deposition of borosilicate glass, or solid boron, or amorphous boron, or $B_2O_3$, or a mixture thereof, or wherein the depositing (a) comprises spin coating of boron.

7. The method of claim 1, wherein the removing (c) comprises etching the boron doping source.

8. The method of claim 1, wherein the depositing (d) comprises chemical vapor deposition of undoped silicon oxide.

9. The method of claim 1, wherein the peak concentration of the boron doped region is less than 5E+19/cm3, and
wherein the boron doped region has a sheet resistance of more than 30 ohm/sq.

10. The method of claim 1, wherein the annealing (b) comprises heating the substrate to a temperature of at least 850 degrees Celsius.

11. The method of claim 1, wherein the annealing (e) comprises heating the substrate to a temperature of at least 900 degrees Celsius.

12. A solar cell comprising a boron-doped region obtainable by the method according to claim 1.

13. The solar cell of claim 12, further comprising a contact made of Ag—Al alloy over the first surface.

14. The solar cell of claim 12, further comprising a seed contact made of Al over the first surface.

15. The method of claim 1, wherein the annealing (b) comprises heating the substrate to a temperature of 900-950 degrees Celsius.

16. The method of claim 1, wherein the peak concentration of the boron doped region is less than 3E+19/cm3, and
wherein the boron doped region has a sheet resistance of between 30 and 200 ohm/sq.

17. The method of claim 1, wherein the annealing (e) comprises heating the substrate to a temperature of 900 to 1150 degrees Celsius.

18. The method of claim 1, wherein the annealing (e) comprises heating the substrate to a temperature of 940 to 1100 degrees Celsius.

* * * * *